(12) United States Patent
Yu et al.

(10) Patent No.: US 11,742,433 B2
(45) Date of Patent: Aug. 29, 2023

(54) FLOATING GATE MEMRISTOR DEVICE AND NEUROMORPHIC DEVICE HAVING THE SAME

(71) Applicant: Research & Business Foundation Sungkyunkwan University, Suwon-si (KR)

(72) Inventors: Woo Jong Yu, Suwon-si (KR); Ui Yeon Won, Ansan-si (KR); Quoc An Vu, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 17/894,242

(22) Filed: Aug. 24, 2022

(65) Prior Publication Data

US 2023/0067092 A1  Mar. 2, 2023

Related U.S. Application Data

(62) Division of application No. 16/928,475, filed on Jul. 14, 2020, now Pat. No. 11,462,647.

(30) Foreign Application Priority Data

Jul. 16, 2019 (KR) .................. 10-2019-0085759

(51) Int. Cl.
| | | |
|---|---|---|
| *H01L 21/00* | (2006.01) | |
| *H01L 29/788* | (2006.01) | |
| *G06N 3/063* | (2023.01) | |
| *H01L 29/423* | (2006.01) | |
| *H01L 29/86* | (2006.01) | |
| *H10B 41/10* | (2023.01) | |
| *H10B 41/30* | (2023.01) | |

(52) U.S. Cl.
CPC .......... *H01L 29/788* (2013.01); *G06N 3/063* (2013.01); *H01L 29/42324* (2013.01); *H01L 29/86* (2013.01); *H10B 41/10* (2023.02); *H10B 41/30* (2023.02)

(58) Field of Classification Search
CPC ........ H10B 41/30; H10B 41/10; G06N 3/063; H01L 29/42324; H01L 29/86
See application file for complete search history.

(56) References Cited

U.S. PATENT DOCUMENTS

| | | | |
|---|---|---|---|
| 6,017,792 A * | 1/2000 | Sharma | H10B 41/30 438/257 |
| 10,860,918 B2 | 12/2020 | Tran et al. | |
| 10,861,550 B1 | 12/2020 | Daryanani et al. | |
| 2020/0203359 A1 * | 6/2020 | Wang | G11C 16/0466 |

* cited by examiner

*Primary Examiner* — Richard A Booth
(74) *Attorney, Agent, or Firm* — NSIP Law

(57) ABSTRACT

Disclosed is a floating gate memristor device comprising: a substrate; a floating gate disposed on the substrate; an insulating layer covering the floating gate; a first electrode including a plurality of control terminals disposed on the insulating layer and spaced apart from each other, wherein the plurality of control terminals vertically overlap the floating gate; a second electrode spaced away from the first electrode, wherein a ground voltage is applied to the second electrode; and a third electrode disposed on the substrate and electrically connected to the floating gate.

4 Claims, 13 Drawing Sheets

[FIG. 1A]
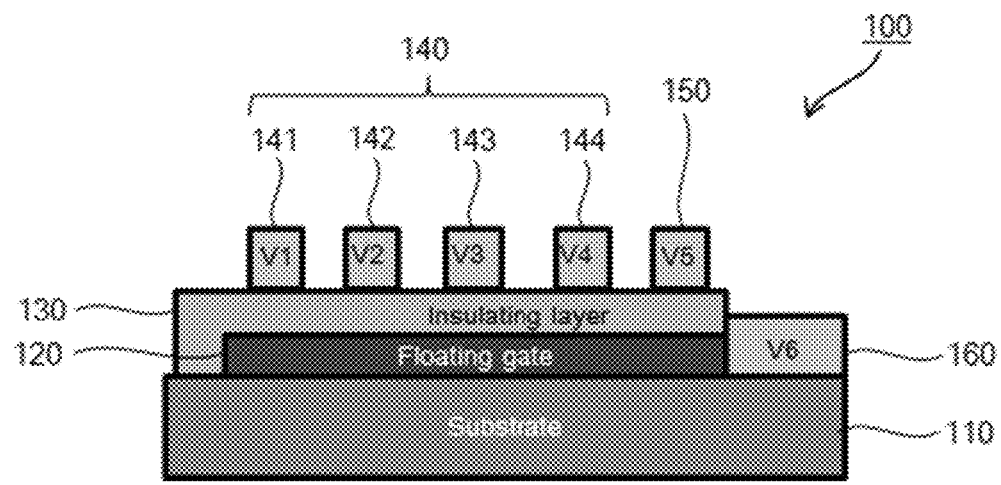
[FIG. 1B]
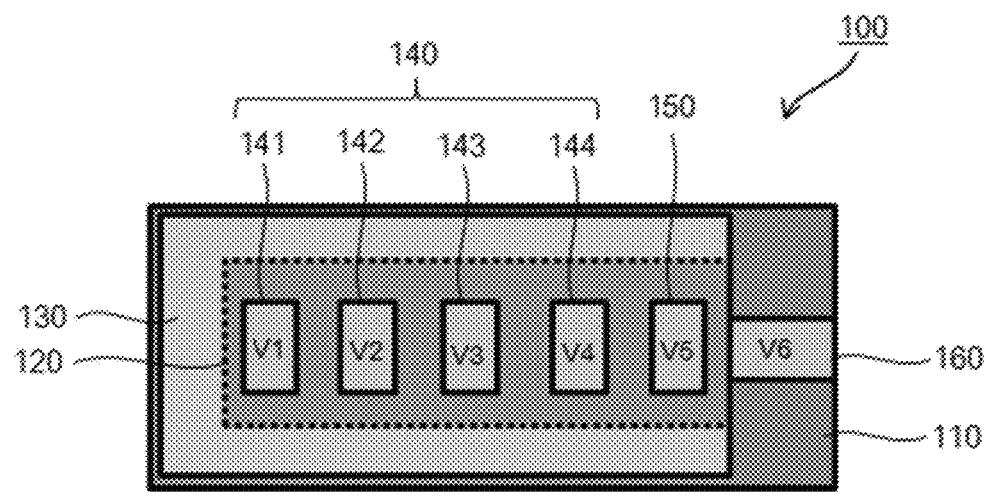

[FIG. 2A]
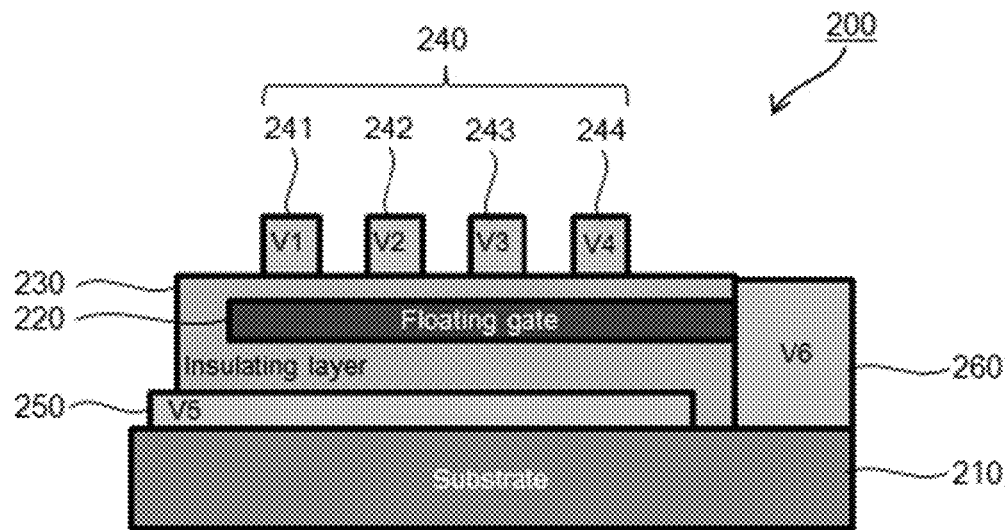
[FIG. 2B]
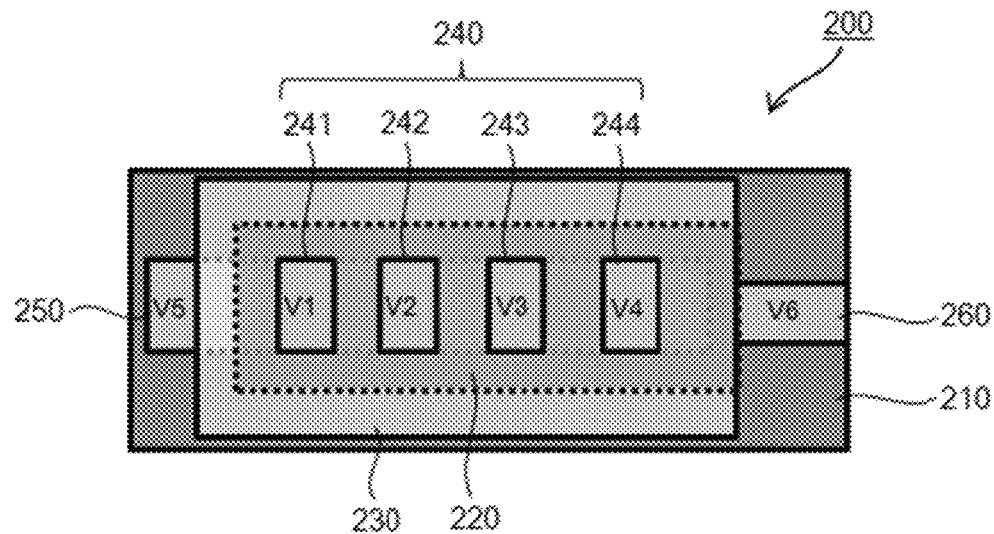

[FIG. 3A]
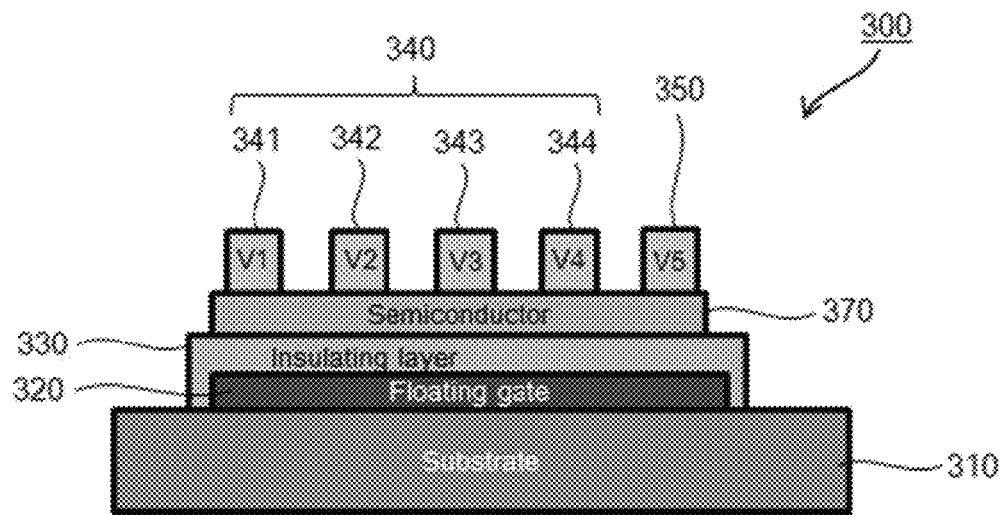
[FIG. 3B]
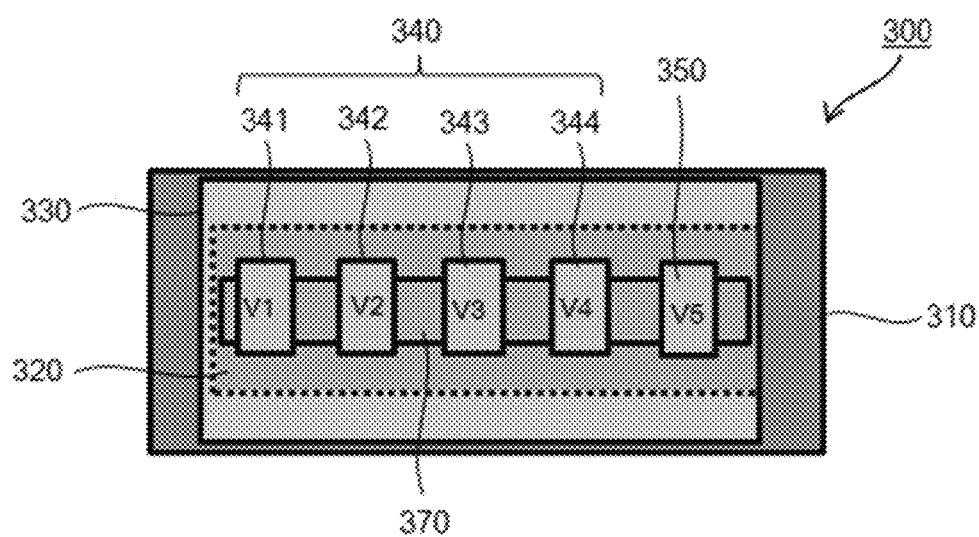

[FIG. 4A]
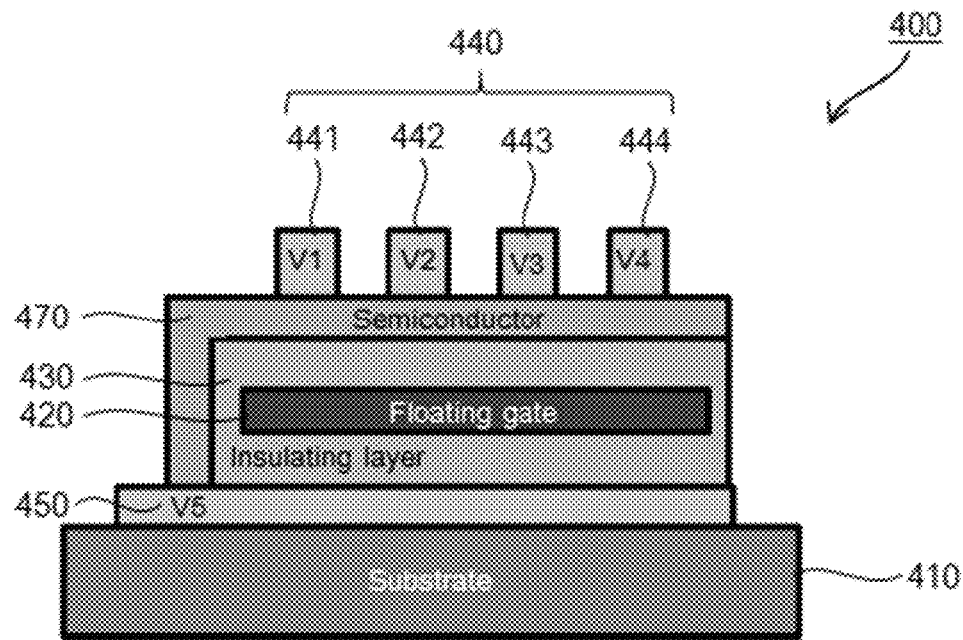
[FIG. 4B]
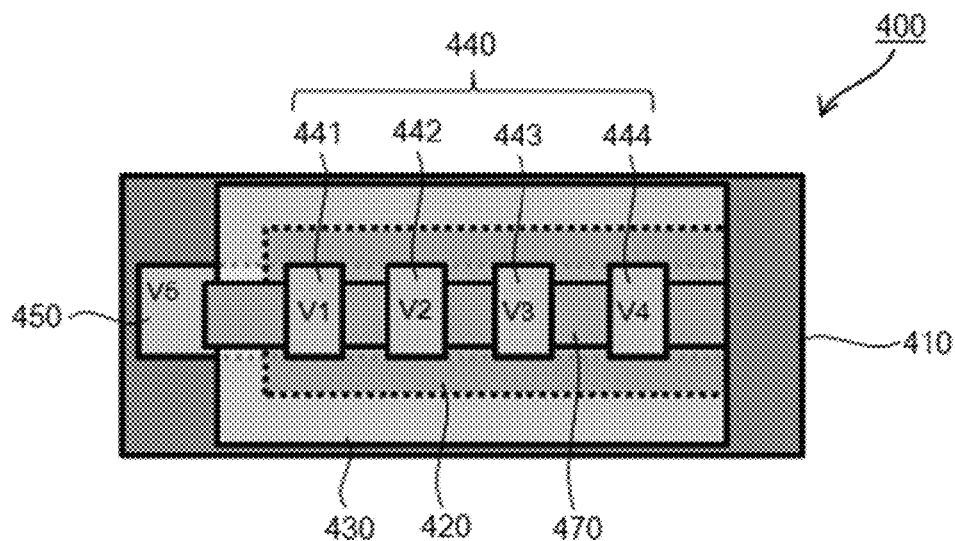

[FIG. 5]
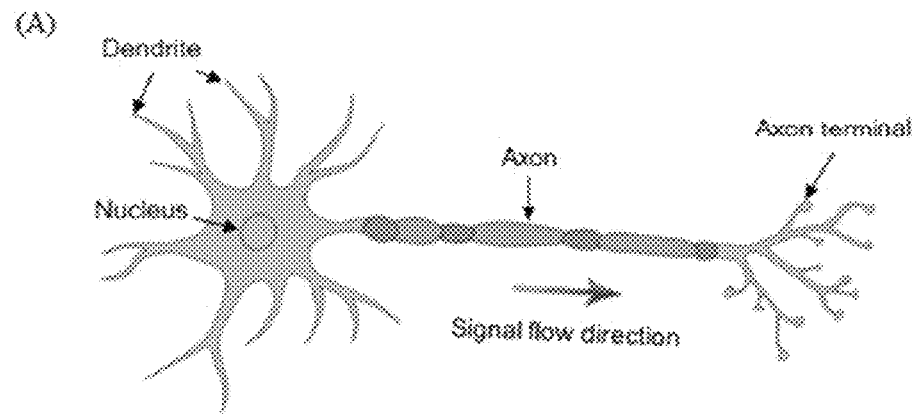
[FIG. 6]
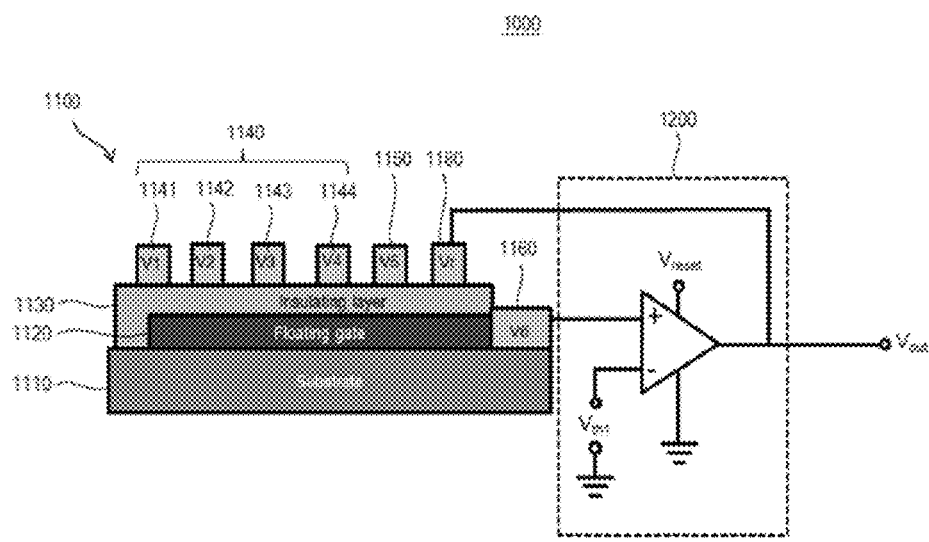

[FIG. 7]
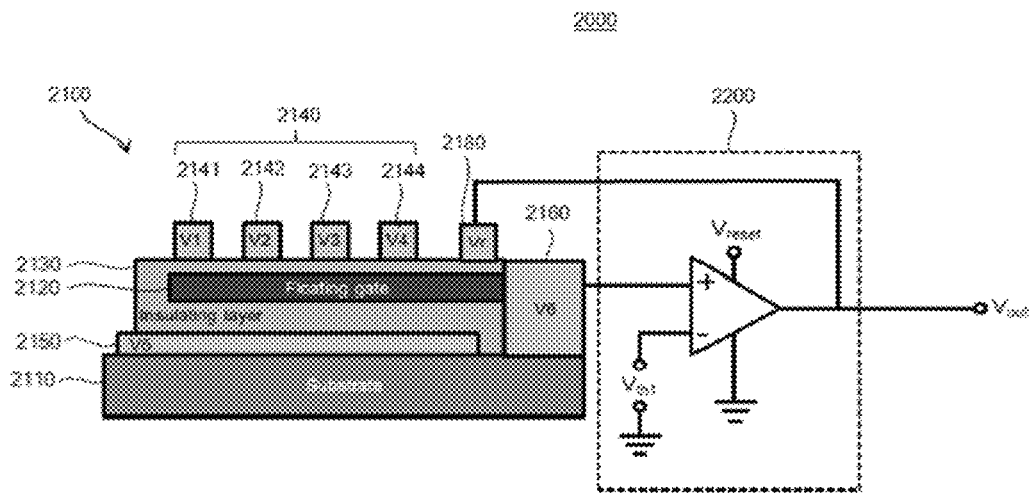
[FIG. 8]
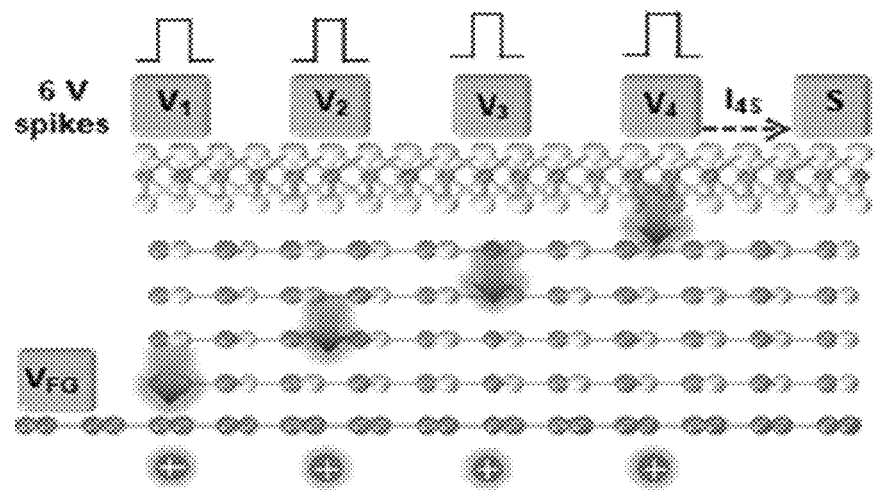
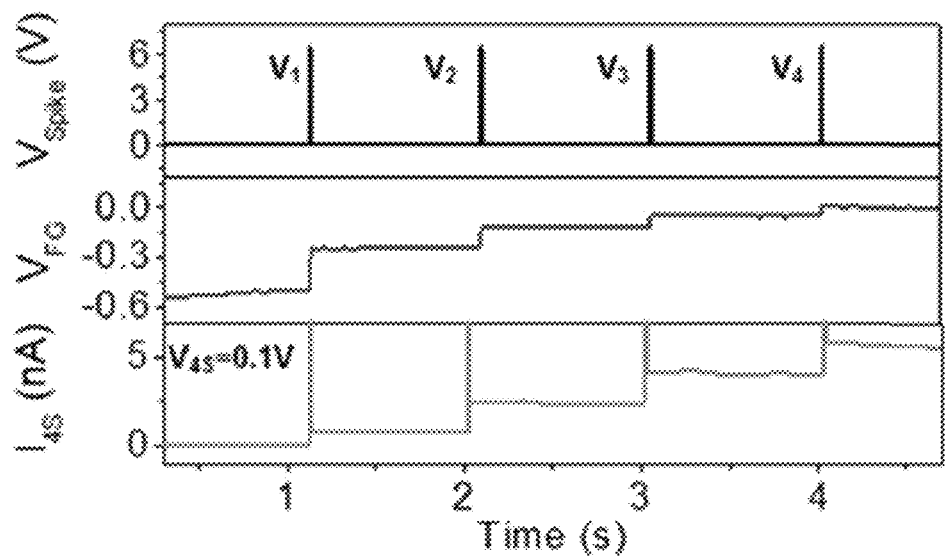

[FIG. 9]
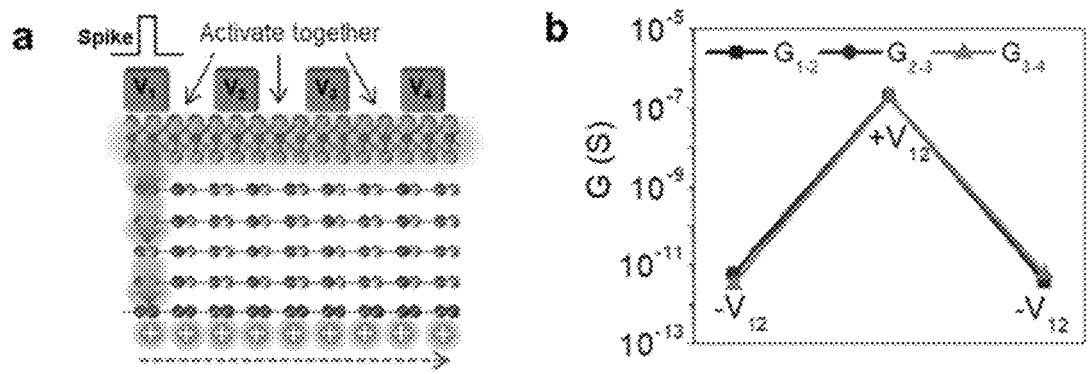
[FIG. 10A]
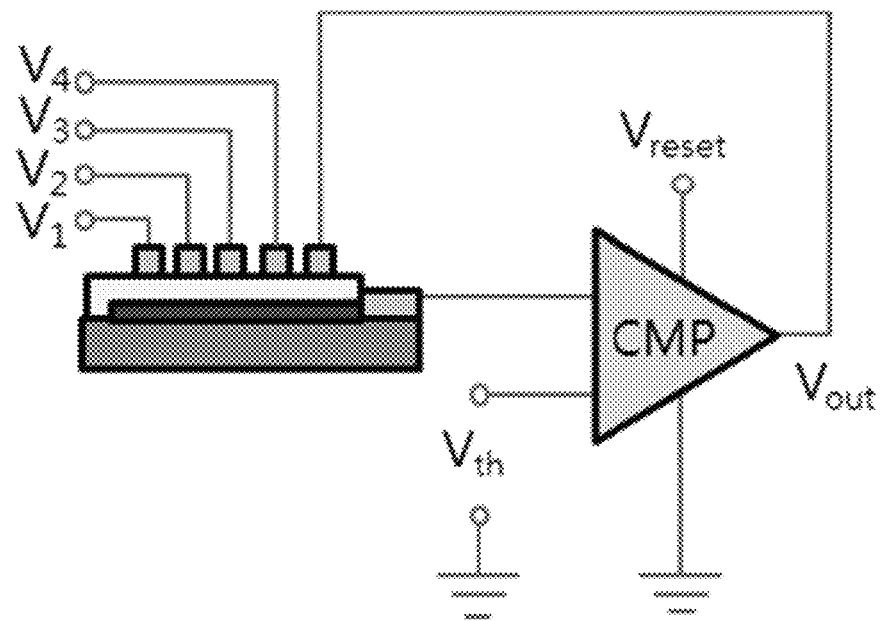

[FIG. 10B]
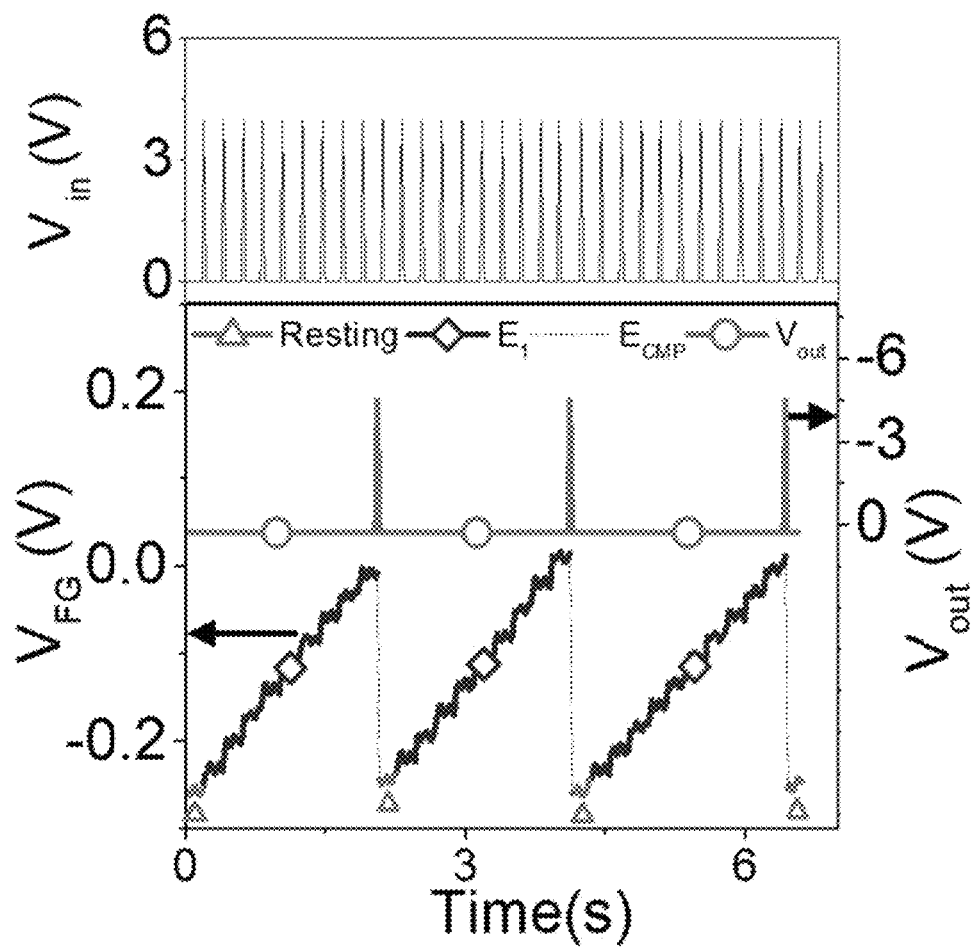

[FIG. 10C]
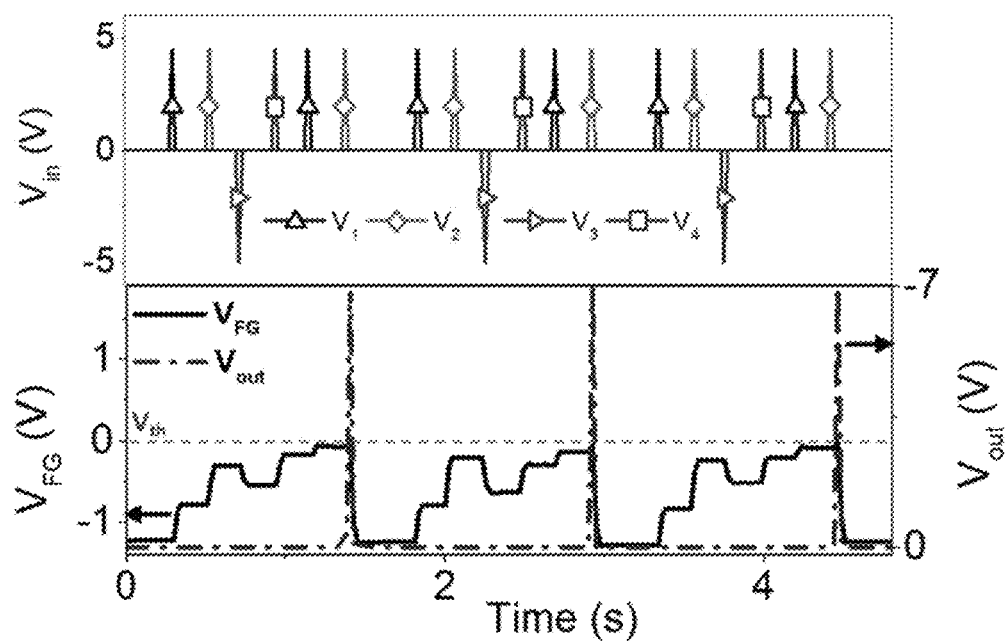
[FIG. 11A]
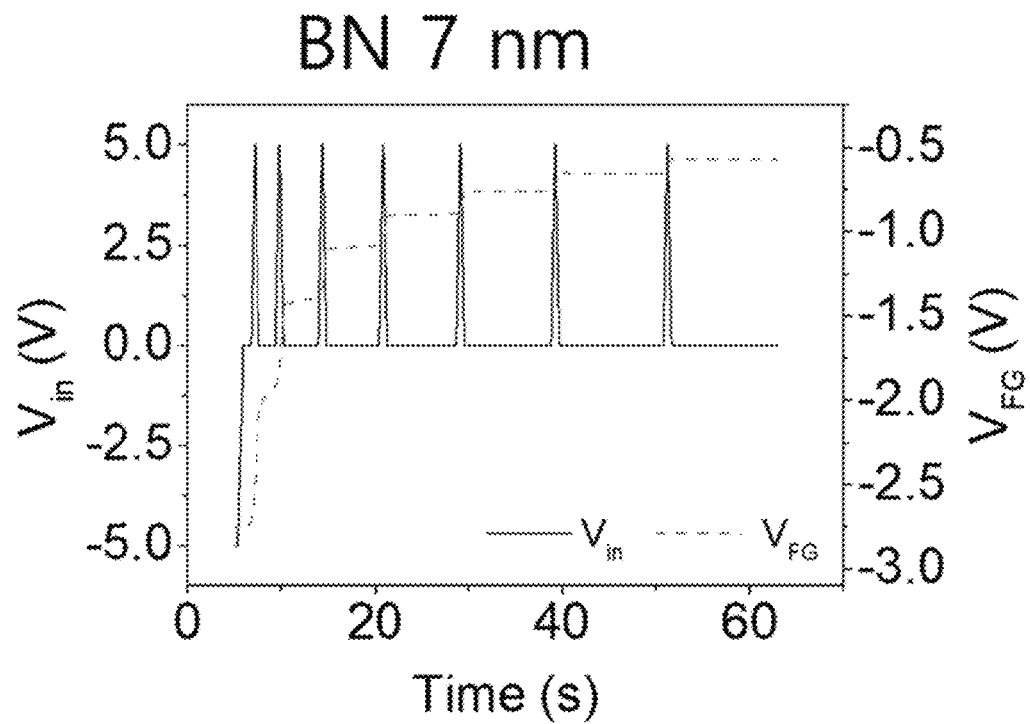

[FIG. 11B]
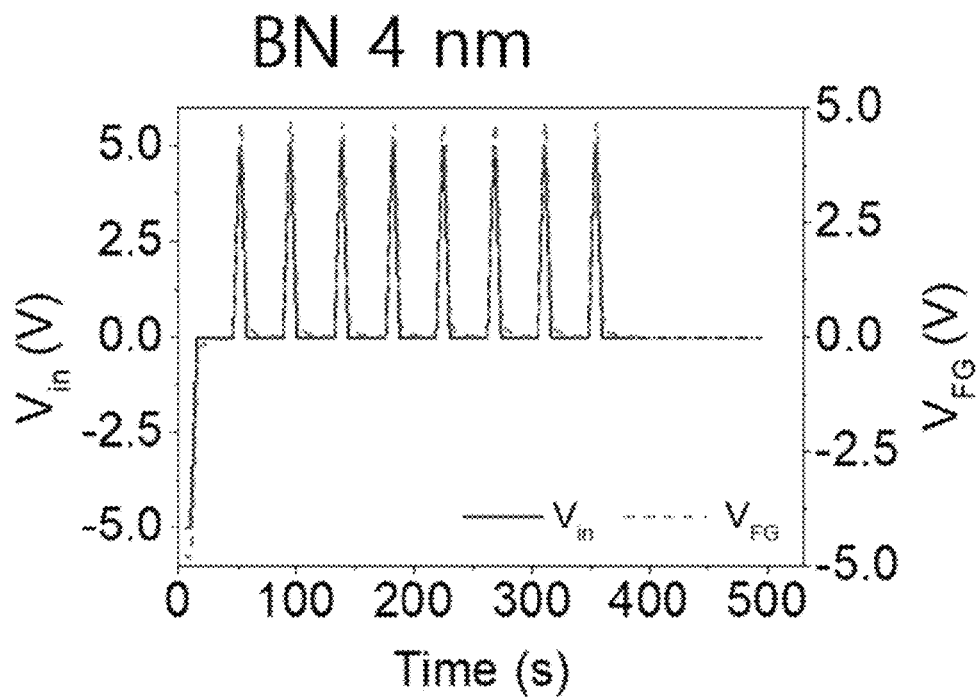
[FIG. 11C]
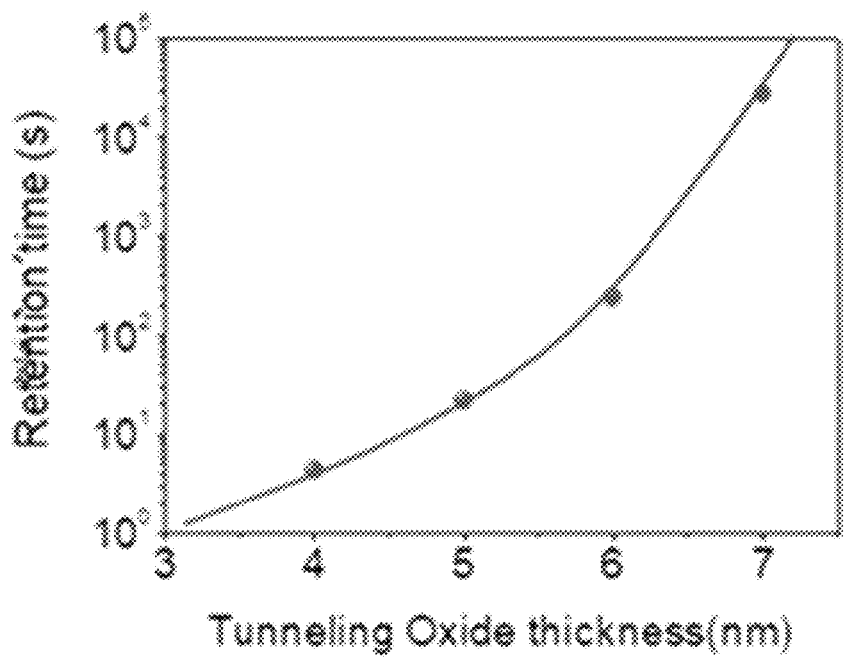

[FIG. 12A]
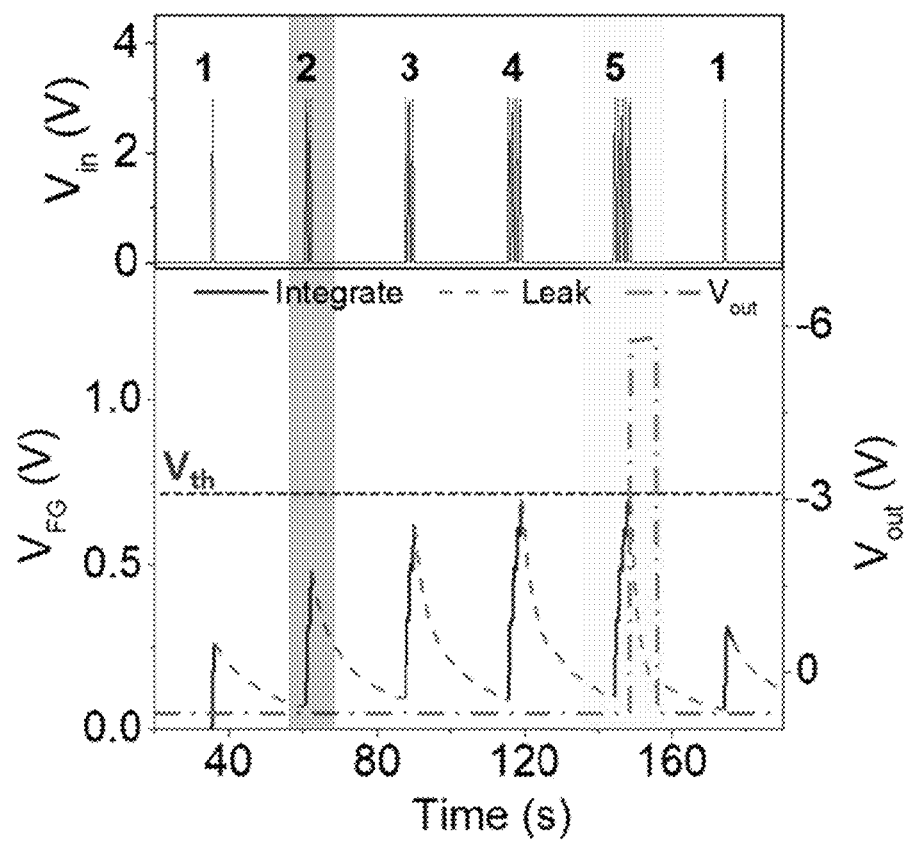

[FIG. 12B]
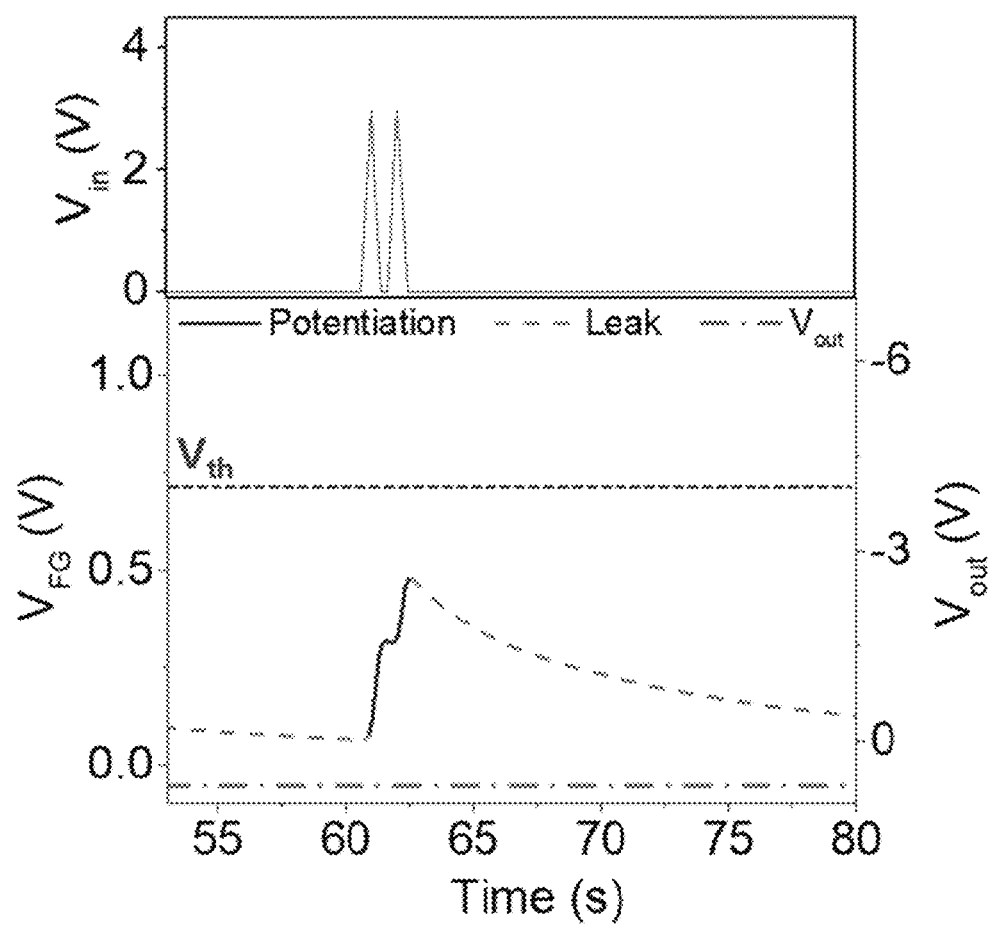

[FIG. 12C]
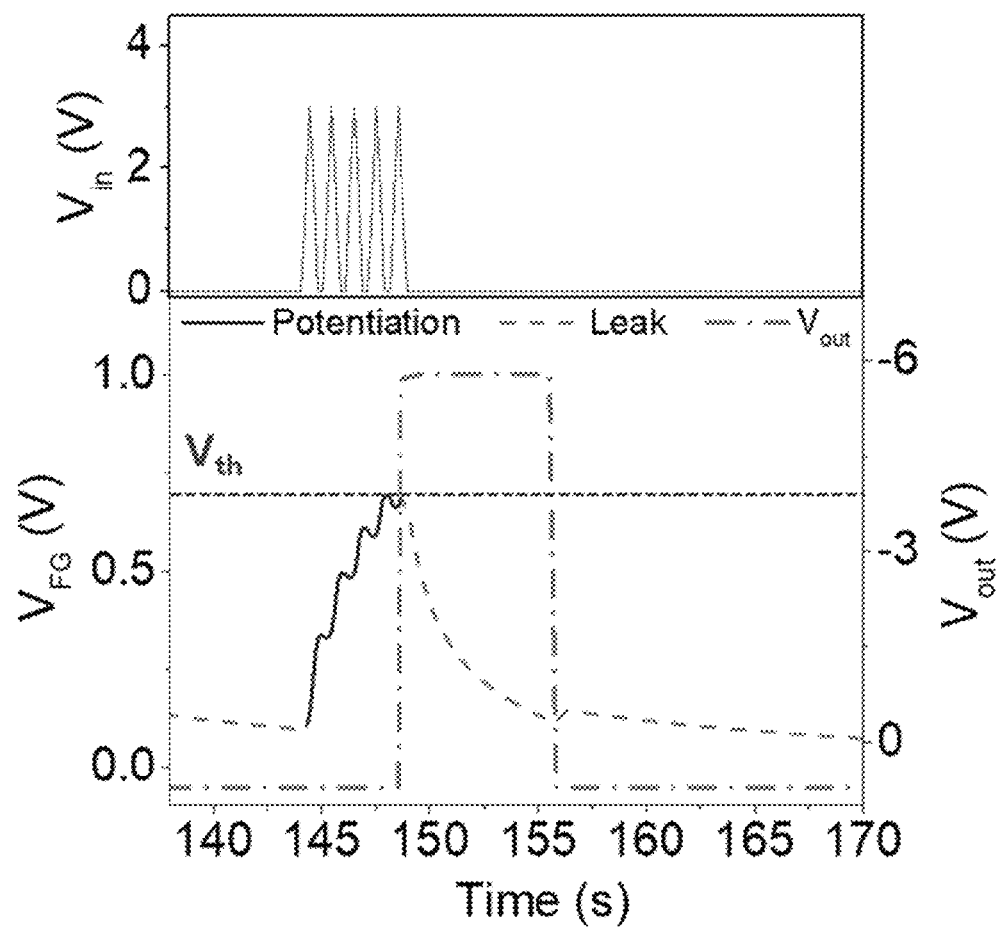

FLOATING GATE MEMRISTOR DEVICE AND NEUROMORPHIC DEVICE HAVING THE SAME

CROSS-REFERENCE TO RELATED APPLICATION

This application is a divisional application of U.S. patent application Ser. No. 16/928,475 filed on Jul. 14, 2020, which claims the benefit under 35 U.S.C. § 119(a) of Korean Patent Application No. 10-2019-0085759 filed on Jul. 16, 2019, in the Korean Intellectual Property Office, the entire disclosure of which is incorporated herein by reference for all purposes.

BACKGROUND

1. Field

The present disclosure relates to a floating gate memristor device capable of storing data using a potential state of a floating gate, and a neuromorphic device having the same and thus capable of implementing a neuromorphic operation.

2. Description of Related Art

A software-based artificial neural network for artificial intelligence based cognition has high power consumption due to mismatch between the software-based artificial neural network and a von Neumann based computer hardware in terms of an operation scheme. To the contrary, a neuromorphic hardware system that mimics a human brain may implement an artificial neural network with less power consumption.

In particular, an artificial neural network using a memristor has lower power consumption and smaller hardware volume than those of a conventional CMOS-based artificial neural network. In order to implement the artificial neural network using the memristor, it is necessary to mimics a neuron (signal processor: CPU) and a synapse (memory).

FIG. 5 is a schematic diagram (A) of a bio neuron, and a graph (B) of a membrane potential variation of a current neuron based on a spike potential of a previous neuron, the graph (B) showing a principle of an operation of a neuron.

As shown in FIG. 5, the neuron is a nerve cell that performs information processing in response to stimulation, and is composed of a neuron cell body including a dendrite and a nucleus, an axon, and an axon terminal.

The neuron cell body receives an electrochemical signal from several previous-neurons connected to a front end of a current neuron via a branch-shaped dendrite and processes the signal, and then transfer information to a subsequent-neuron via the axon and the axon terminal.

Various ions such as $Na^+$, $K^+$, and $Cl^-$ exist inside and outside the neuron. A membrane potential as a difference between a potential inside and a potential outside the cell is generated due to movement of the ions. The membrane potential maintains an idle state of about −70 mV normally. When a spike potential as an electrical signal was transmitted from the previous-neuron to the current-neuron, an excitatory postsynaptic potential (EPSP) or an inhibitory postsynaptic potential (IPSP) is generated and thus the membrane potential increases or decreases, depending on characteristics of a synapse as a connection between adjacent neurons.

In this connection, when the membrane potential is lower than a threshold voltage of about −50 mV to −55 mV, charges gradually exit the neuron which in turn returns to the idle state. This is referred to as 'leaky potential behavior of neuron'. To the contrary, when multiple excitatory postsynaptic potential (EPSPs) are sequentially delivered in a short time interval, the membrane potential varies by a sum of the EPSPs. This is referred to as 'integrate behavior of neuron'.

When the membrane potential becomes higher than the threshold voltage, a sodium ion channel ($Na^+$ channel) existing in the neuron cell membrane is opened and external sodium ions ($Na^+$) are introduced into the neuron. Then, the introduced sodium ions allows the neuron to generate the spike potential of about +30 mV as an activation potential, and transmits an electrical signal to the subsequent-neuron. This is referred to as 'fire behavior of neuron'. Next, the neuron discharges the potassium ions ($K^+$) through a potassium ion channel ($K^+$ channel) out of the cell and in turn returns to an original idle state. This behavior of the neuron is referred to as 'leaky integrate and fire behavior of neuron'. This process is a basic principle of a human brain operation.

Eleftheriou researchers from the IBM company have implemented 'integrate and fire (leaky potential behavior being excluded) behavior' of the neuron, using a phase change memristor. In this connection, a resistance variation of the phase variation memristor was assumed to be a membrane potential variation of the neuron.

A professor Philip Wong of Stanford University realized the neuron behavior using a RRAM-based memcapacitor whose capacitor size changes according to an applied voltage based on a structure of metal-oxide film-metal-oxide film. In this connection, the size variation of the capacitor was used to produce a neuron-mimicking device and to implement 'leaky integrate and fire behavior' of the neuron.

However, active research is needed on a device that may implement the neuron behavior.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a floating gate memristor device in which a voltage of a floating gate or a conductance of a semiconductor channel may be adjusted to a plurality of states using control voltages input from a plurality of control terminals.

Another purpose of the present disclosure is to provide a neuromorphic device having the floating gate memristor device.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

A first aspect of the present disclosure provides a floating gate memristor device comprising: a substrate; a floating gate disposed on the substrate; an insulating layer covering the floating gate; a first electrode including a plurality of control terminals disposed on the insulating layer and spaced apart from each other, wherein the plurality of control terminals vertically overlap the floating gate; a second electrode spaced away from the first electrode, wherein a ground voltage is applied to the second electrode; and a third electrode disposed on the substrate and electrically connected to the floating gate.

In one implementation of the first aspect, when a control voltage is applied to a first control terminal of the control terminals, charges tunnel between the first control terminal and the floating gate.

In one implementation of the first aspect, a control voltage selected from a group consisting of a ground voltage, a first control voltage greater than the ground voltage, and a second control voltage lower than the ground voltage is sequentially applied to the control terminals at a predetermined interval.

In one implementation of the first aspect, a potential of the floating gate is controlled based on control voltages applied to the control terminals.

In one implementation of the first aspect, the second electrode is disposed on the insulating layer.

In one implementation of the first aspect, the second electrode is disposed between the substrate and the floating gate and vertically overlaps all of the control terminals.

In one implementation of the first aspect, the insulating layer includes a first portion disposed between the control terminals and the floating gate, and a second portion disposed between the second electrode and the floating gate, wherein in order to suppress tunneling of the charges between the floating gate and the second electrode, a thickness of the second portion is greater than a thickness of the first portion.

A second aspect of the present disclosure provides a floating gate memristor device comprising: a substrate; a floating gate disposed on the substrate; an insulating layer covering the floating gate; a semiconductor channel disposed on the insulating layer and vertically overlapping the floating gate; a first electrode including a plurality of control terminals disposed on the semiconductor channel and spaced apart from each other, wherein the plurality of control terminals vertically overlap the floating gate; and a second electrode spaced away from the first electrode, wherein a ground voltage is applied to the second electrode.

In one implementation of the second aspect, the second electrode is disposed on the semiconductor channel.

In one implementation of the second aspect, the second electrode is disposed between the substrate and the floating gate and vertically overlaps all of the control terminals.

In one implementation of the second aspect, a control voltage selected from a group consisting of a ground voltage, a first control voltage greater than the ground voltage, and a second control voltage lower than the ground voltage is sequentially applied to the control terminals at a predetermined interval, wherein when a control voltage is applied to a first control terminal of the control terminals, charges tunnel between the first control terminal and the floating gate, wherein an amount of current flowing through the semiconductor channel or a conductance of the semiconductor channel is controlled based on the control voltages applied to the control terminals.

A third aspect of the present disclosure provides a neuromorphic device comprising: a floating gate memristor device including: a substrate; a floating gate disposed on the substrate; an insulating layer covering the floating gate; a first electrode including a plurality of control terminals disposed on the insulating layer and spaced apart from each other, wherein the plurality of control terminals vertically overlap the floating gate; a second electrode spaced away from the first electrode, wherein a ground voltage is applied to the second electrode; a reset electrode disposed on the insulating layer and vertically overlapping the floating gate; and a third electrode disposed on the substrate and electrically connected to the floating gate; and a reset voltage generator including an input terminal electrically connected to the third electrode and an output terminal electrically connected to the reset electrode, wherein when a voltage of the floating gate is greater than a first threshold voltage, the reset voltage generator is configured to generate a reset voltage and apply the reset voltage to the reset electrode.

In one implementation of the third aspect, when the reset voltage is applied to the reset electrode, charges tunnel between the reset electrode and the floating gate, such that charges charged in the floating gate are discharged and thus a voltage of the floating gate returns to an initial state.

In one implementation of the third aspect, the second electrode is disposed on the insulating layer.

In one implementation of the third aspect, the second electrode is disposed between the substrate and the floating gate and vertically overlaps all of the control terminals.

Effects of the present disclosure may be as follows but may not be limited thereto.

According to the floating gate memristor device according to the present disclosure, an amount of charges stored in the floating gate may be adjusted to a plurality of states, based on the control voltages of $-V_1$', '0', and '+$V_2$' applied to the control terminals of the first electrode. As a result, an amount of data that may be stored therein may be significantly increased.

According to the neuromorphic device according to the present disclosure, when the control voltages are applied to the control terminals of the first electrode of the floating gate memristor device, a potential of the floating gate increases sequentially, and becomes higher than a first threshold voltage of the reset voltage generator. Thus, the charges accumulated in the floating gate may be discharged using the reset voltage generated from the reset voltage generator. Therefore, the neuromorphic device according to the present disclosure may implement the neuron behavior.

In addition to the effects as described above, specific effects of the present disclosure will be described together with the detailed description for carrying out the disclosure.

BRIEF DESCRIPTION OF DRAWINGS

FIG. 1A and FIG. 1B are respectively cross-sectional and plan views illustrating a floating gate memristor device according to the first embodiment of the present disclosure.

FIG. 2A and FIG. 2B are respectively cross-sectional and plan views illustrating a floating gate memristor device according to a second embodiment of the present disclosure.

FIG. 3A and FIG. 3B are respectively cross-sectional and plan views illustrating a floating gate memristor device according to a third embodiment of the present disclosure.

FIG. 4A and FIG. 4B are respectively cross-sectional and plan views illustrating a floating gate memristor device according to a fourth embodiment of the present disclosure.

FIG. 5 is a schematic diagram (A) of a bio neuron, and a graph (B) of a membrane potential variation a current neuron based on a spike potential of a previous neuron.

FIG. 6 is a view for illustrating a neuromorphic device according to an embodiment of the present disclosure.

FIG. 7 is a view for illustrating a neuromorphic device according to another embodiment of the present disclosure.

FIG. 8 shows measurements of a potential of a floating gate and a current of a semiconductor channel when +6V control voltages are sequentially applied to four control terminals of the floating gate memristor device having a structure of the third embodiment at a 1 second interval.

FIG. 9 shows a result of measuring a conductance (G) in a semiconductor channel region located between the adjacent control terminals when a negative control voltage $-V_{12}$ is applied to a first control terminal among control terminals of the floating gate memristor device having the structure of embodiment 3 and when a positive control voltage $+V_{12}$ is applied to the first control terminal.

FIG. 10A is a diagram showing a configuration of a device manufactured for testing.

FIG. 10B and FIG. 10C are graphs showing a variation in a potential of a floating gate as measured when a control voltage of 3.5V is sequentially applied to control terminals of the device shown in FIG. 10A.

FIG. 11A and FIG. 11B are graphs showing a variation of a floating gate potential $V_{FG}$ when an input potential $V_{in}$ is applied to a neuromorphic device of a structure shown in FIG. 10A where a thickness of an insulating layer is 7 nm and 4 nm, respectively.

FIG. 11C is a graph measuring a variation in a retention time of a floating gate based on the thickness of the insulating layer.

FIG. 12A to 12C are graphs measuring a variation of a floating gate potential with respect to an input potential to the neuromorphic device of the structure shown in FIG. 10A when the thickness of the insulating layer is 4 nm.

DETAILED DESCRIPTIONS

For simplicity and clarity of illustration, elements in the figures. are not necessarily drawn to scale. The same reference numbers in different figures. denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Floating Gate Memristor Device

FIG. 1A and FIG. 1B are respectively cross-sectional and plan views illustrating a floating gate memristor device according to a first embodiment of the present disclosure.

Referring to FIG. 1A and FIG. 1B, a floating gate memristor device 100 according to the first embodiment of the present disclosure includes a substrate 110, a floating gate 120, an insulating layer 130, a first electrode 140, a second electrode 150 and a third electrode 160.

The substrate 110 acts as a support substrate. A shape or a structure thereof is not particularly limited. However, a surface of the substrate 110 may be made of an insulating material so that charges stored in the floating gate 120 do not leak. For example, the substrate 110 may include a metal substrate or a semiconductor substrate or a polymer substrate whose a surface is coated with an insulating layer.

The floating gate 120 may be disposed on the substrate 110, and may have a monolithic structure with a constant planar area and a constant thickness. For example, the floating gate 120 may have a rectangular structure having a predetermined thickness. The floating gate 120 may be made of a material having high mobility of charges such as electrons and holes. For example, the floating gate 120 may be made of a material such as metal or graphene, but may not be limited thereto.

The insulating layer 130 may be disposed on the floating gate 120 to cover the floating gate 120 and may be made of an insulating material. In one example, at least a portion of the insulating layer 130 disposed between the floating gate 120 and the first electrode 140 may have a constant thickness. For example, the portion of the insulating layer 130 disposed between the floating gate 120 and the first electrode 140 may be formed to have a thickness that allows tunneling of electric charges between the first electrode 140 and the floating gate 120.

The first electrode 140 may include a plurality of control terminals 141, 142, 143, and 144 which may be spaced apart from each other and may be disposed on the insulating layer 130, and vertically overlap the floating gate 120 and may be made of an electrically conductive material. In one embodiment, the plurality of control terminals 141, 142, 143, and 144 may be arranged in a line and may be spaced apart from each other at a regular spacing and may be disposed on the insulating layer 130, and may have the same shape and structure. In FIG. 1A and FIG. 1B, the first electrode 140 is shown to include the four control terminals 141, 142, 143, and 144. However, the present disclosure is not limited thereto. the number of the control terminals may be adjusted to 3 or smaller or 5 or greater depending on applications.

Control voltages may be applied to the control terminals 141, 142, 143, and 144 independently of each other. In one embodiment, the same control voltage or different control voltages may be sequentially applied to the control terminals 141, 142, 143, and 144 at a predetermined time interval, respectively. For example, control voltages to applied to the control terminals 141, 142, 143, and 144, respectively may be '$-V_1$', '0', and '$+V_2$'.

When the control voltage is applied to each of the control terminals 141, 142, 143, and 144, charges may tunnel from the control terminal to which the control voltage is applied to the floating gate 120. For example, when a negative control voltage $-V_1$ is applied to a first control terminal as one of the control terminals 141, 142, 143, and 144, electrons may migrate from the first control terminal to the floating gate 120 and may be stored therein. When a positive control voltage $+V_2$ is applied to the first control terminal, holes may migrate from the first control terminal to the floating gate 120 and then may be stored therein.

The second electrode 150 may be spaced apart from the first electrode 140 and may be disposed on the insulating layer 130. A ground voltage may be applied to the second electrode 150. When the ground voltage is applied to the second electrode 150, and control voltages different from the ground voltage are applied to the control terminals 141, 142, 143, and 144, respectively, an electrical field may be generated due to a difference between the control voltages of the control terminals 141, 142, 143, and 144 and the ground voltage of the second electrode 150. The electrical field may allow tunneling of the electric charges between the control terminals 141, 142, 143, and 144 and the floating gate 120.

The third electrode 160 may be disposed on the substrate 110 and may be electrically connected to the floating gate 120, for example, may directly contact the floating gate 120. The third electrode 160 may not be covered with the insulating layer 130 so that the third electrode 160 may be connected to an external device (not shown). In the drawings, the third electrode 160 is shown as a separate component from the floating gate 120. However, the present disclosure may not be limited thereto. In an example where the third electrode 160 is integral with the floating gate 120, the third electrode 160 may be formed by exposing a portion of the floating gate 120 such that the insulating layer 130 may not cover the portion.

According to the floating gate memristor device of the first embodiment, an amount of charges stored in the floating gate may be adjusted to a plurality of states, based on the control voltages of '$-V_1$', '0', and '$+V_2$' applied to the control terminals of the first electrode. As a result, a voltage of the third electrode electrically connected to the floating gate may be adjusted to the plurality of states. Thus, the floating gate memristor device of the first embodiment may store data using the various voltage states of the third electrode. As a result, an amount of data that may be stored therein may be significantly increased.

FIG. 2A and FIG. 2B are respectively cross-sectional and plan views illustrating a floating gate memristor device according to a second embodiment of the present disclosure.

Referring to FIG. 2A and FIG. 2B, a floating gate memristor device 200 according to the second embodiment of the present disclosure includes a substrate 210, a floating gate 220, an insulating layer 230, a first electrode 240, a second electrode 250, and a third electrode 260.

In the floating gate memristor device 200 according to the second embodiment, the second electrode 250 to which a ground voltage is applied is disposed between the substrate 210 and the floating gate 220. The insulating layer 230 is disposed between the floating gate 220 and the first electrode 240 to achieve insulation therebetween, and is disposed between the floating gate 220 and the second electrode 250 to achieve insulation therebetween. Except for those arrangements, the floating gate memristor device 200 is substantially the same as the floating gate memristor device 100 according to the first embodiment described with reference to FIG. 1A and FIG. 1B. Thus, hereinafter, detailed descriptions of the same configurations therebetween will be omitted, and descriptions will focus on the differences between configurations of the floating gate memristor device 200 and the floating gate memristor device 100 according to the first embodiment.

The second electrode 250 may be disposed between the substrate 210 and the floating gate 220 while vertically overlapping control terminals 241, 242, 243, and 244 of the first electrode 240. For example, the second electrode 250 may have a monolithic structure with a rectangular shape extending in an elongate manner along an arrangement direction of the control terminals 241, 242, 243, and 244.

In the floating gate memristor device 200 according to the second embodiment, unlike the floating gate memristor device 100 according to the first embodiment, the second electrode 250 to which the ground voltage is applied is interposed between the insulating layer 230 and the substrate 210 such that the insulating layer 230 is sandwiched between the second electrode 250 and the floating gate 220.

The second electrode 250 to which the ground voltage is disposed below the control terminals 241, 242, 243 and 244. Thus, a separation distance between the second electrode 250 and the control terminals 241, 242, 243, and 244 may be reduced. Thus, even when a lower control voltage is applied to the control terminals 241, 242, 243, and 244, a strong electrical field that enables the tunneling of charges between the control terminals 241, 242, 243, and 244 and the floating gate 220 may be generated.

In order to suppress the tunneling of the electric charges between the second electrode 250 and the floating gate 220, a thickness of a first portion of the insulating layer 230 located between the control terminals 241, 242, 243, and 244 and the floating gate 220 may be smaller than a thickness of a second portion thereof located between the second electrode 250 and the floating gate 220.

An operation principle of the floating gate memristor device 200 according to the second embodiment is substantially the same as that of the floating gate memristor device 100 according to the first embodiment. Thus, detailed descriptions thereof will be omitted.

According to the floating gate memristor device of the second embodiment, an amount of charges stored in the floating gate may be adjusted to a plurality of states, based on the control voltages of $-V_1$', '0', and '$+V_2$' applied to the control terminals of the first electrode. As a result, a voltage of the third electrode electrically connected to the floating gate may be adjusted to the plurality of states. Thus, the floating gate memristor device of the second embodiment may store data using the various voltage states of the third electrode. As a result, an amount of data that may be stored therein may be significantly increased. Further, because the second electrode is disposed under the control terminals while the insulating layer is interposed between the second electrode and the control terminals, a magnitude of the control voltage to applied for operation may be reduced.

FIG. 3A and FIG. 3B are respectively cross-sectional and plan views illustrating a floating gate memristor device according to a third embodiment of the present disclosure.

Referring to FIG. 3A and FIG. 3B, a floating gate memristor device 300 according to the third embodiment of the present disclosure includes a substrate 310, a floating gate 320, an insulating layer 330, a first electrode 340, a second electrode 350, and a semiconductor channel 370.

The substrate 310, the floating gate 320 and the insulating layer 330 are respectively and substantially the same as the substrate 110, the floating gate 120 and the insulating layer 130 of the floating gate memristor device 100 according to the first embodiment as described with reference to FIG. 1A and FIG. 1B. Duplicated detailed descriptions thereof will be omitted.

The semiconductor channel 370 may be disposed on the insulating layer 330. The semi-chromatic channel 370 may vertically overlap the floating gate 320. The semiconductor channel 370 may be made of a p-type or n-type semiconductor material, and may have a rectangular monolithic structure extending in one direction.

The first electrode 340 may include a plurality of control terminals 341, 342, 343, and 344 which may be disposed on the semiconductor channel 370 and may be spaced apart from each other, and may vertically overlap the floating gate 120 and may be made of an electrically conductive material. In one embodiment, the plurality of control terminals 341, 342, 343, and 344 may be arranged in a line and may be spaced apart from each other at a regular spacing and may be disposed on the semiconductor channel 370, and may have the same shape and structure. The plurality of control terminals 341, 342, 343, and 344 may directly contact the semiconductor channel 370.

Control voltages may be applied to the control terminals 341, 342, 343, and 344 independently of each other. In one embodiment, the same control voltage or different control voltages may be sequentially applied to the control terminals 341, 342, 343, and 344 at a predetermined time interval, respectively. For example, control voltages to applied to the control terminals 341, 342, 343, and 344, respectively may be '$-V_1$', '0', and '$+V_2$'.

When the control voltage is applied to each of the control terminals 341, 342, 343, and 344, charges may tunnel from the control terminal to which the control voltage is applied to the floating gate 320. For example, when a negative control voltage $-V_1$ is applied to a first control terminal as one of the control terminals 341, 342, 343, and 344, electrons may migrate from the first control terminal to the floating gate 320 and may be stored therein. When a positive control voltage $+V_2$ is applied to the first control terminal, holes may migrate from the first control terminal to the floating gate 320 and then may be stored therein.

The second electrode 350 may be spaced apart from the first electrode 340 and may be disposed on the semiconductor layer 370. A ground voltage may be applied to the second electrode 350. When the ground voltage is applied to the second electrode 350, and control voltages different from the ground voltage are applied to the control terminals 341, 342, 343, and 344, respectively, an electrical field may be generated due to a difference between the control voltages of the control terminals 341, 342, 343, and 344 and the ground voltage of the second electrode 350. The electrical field may allow tunneling of the electric charges between the control terminals 341, 342, 343, and 344 and the floating gate 320.

In one example, when connecting the second electrode 350 to an external device (not shown), current flowing through the semiconductor channel 370 may be fed to the external device.

In the floating gate memristor device 300 of the third embodiment, a conductance of the semiconductor channel 370 may be adjusted based on a type and an amount of charges stored in the floating gate 320.

In one embodiment, when the semiconductor channel 370 is made of an n-type semiconductor material, and when negative control voltages are applied to the control terminals 341, 342, 343, and 344, respectively, electrons accumulate in the floating gate 320, such that a negative electrical field is generated in the floating gate 320, thereby to raise up an energy band of the semiconductor channel 370. Thus, a conductance of the semiconductor channel 370 may be lowered. As a result, an amount of current flowing through the semiconductor channel 370 may be reduced. In this case, as an amount of the electrons accumulated in the floating gate 320 increases, the conductance of the semiconductor channel 370 decreases.

In another example, when the semiconductor channel 370 is made of a n-type semiconductor material, and when positive control voltages are applied to the control terminals 341, 342, 343, and 344, respectively, and holes accumulate in the floating gate 320. Thus, a positive electrical field is generated in the floating gate 320, thereby to lower the energy band of the semiconductor channel 370 to increase the conductance of the semiconductor channel 370. As a result, an amount of current flowing through the semiconductor channel 370 may be increased. In this case, as an amount of holes accumulated in the floating gate 320 increases, the conductance of the semiconductor channel 370 increases.

According to the floating gate memristor device of the third embodiment, an amount of charges stored in the floating gate may be adjusted to a plurality of states, based on the control voltages of '−$V_1$', '0', and '+$V_2$' applied to the control terminals of the first electrode. As a result, the conductance of the semiconductor channel or the amount of current flowing through the semiconductor channel may be adjusted to the plurality of states. Thus, the floating gate memristor device of the third embodiment may store data using the various voltage states of the conductance of the semiconductor channel or the amount of current flowing through the semiconductor channel. As a result, an amount of data that may be stored therein may be significantly increased.

FIG. 4A and FIG. 4B are respectively cross-sectional and plan views illustrating a floating gate memristor device according to a fourth embodiment of the present disclosure.

Referring to FIG. 4A and FIG. 4B, a floating gate memristor device 400 according to the fourth embodiment of the present disclosure includes a substrate 410, a floating gate 420, an insulating layer 430, a first electrode 440, a second electrode 450, and a semiconductor channel 470.

In the floating gate memristor device 400 according to the fourth embodiment, the second electrode 450 to which a ground voltage is applied is disposed between the substrate 410 and the floating gate 420. The insulating layer 430 is disposed between the floating gate 420 and the semiconductor channel 470 to achieve insulation therebetween, and is disposed between the floating gate 420 and the second electrode 450 to achieve insulation therebetween. Except for those arrangements, the floating gate memristor device 400 is substantially the same as the floating gate memristor device 300 according to the third embodiment as described with reference to FIG. 3A and FIG. 3B. Thus, hereinafter, detailed descriptions of the same configurations therebetween will be omitted, and descriptions will focus on the differences between configurations of the floating gate memristor device 400 and the floating gate memristor device 300 according to the third embodiment.

The second electrode 450 may be disposed between the substrate 410 and the floating gate 420 and may vertically overlap control terminals 441, 442, 443, and 444 of the first electrode 440. For example, the second electrode 450 may have a monolithic structure having a rectangular shape extending in an elongate manner along an arrangement direction of the control terminals 441, 442, 443, and 444.

In the floating gate memristor device 400 according to the fourth embodiment, unlike the floating gate memristor device 300 according to the third embodiment, the second electrode 450 to which the ground voltage is applied is interposed between the insulating layer 430 and the substrate 410 such that the insulating layer 430 is sandwiched between the second electrode 450 and the floating gate 420. The second electrode 450 to which the ground voltage is disposed below the control terminals 441, 442, 443 and 444. Thus, a separation distance between the second electrode 450 and the control terminals 441, 442, 443, and 444 may be reduced. Thus, even when a lower control voltage is applied to the control terminals 441, 442, 443, and 444, a strong electrical field that enables the tunneling of charges between the control terminals 441, 442, 443, and 444 and the floating gate 420 may be generated.

In order to suppress the tunneling of the electric charges between the second electrode 450 and the floating gate 420, a thickness of a first portion of the insulating layer 430 located between the control terminals 441, 442, 443, and 444 and the floating gate 420 may be smaller than a thickness of a second portion thereof located between the second electrode 450 and the floating gate 420.

In one example, the semiconductor channel 470 may further extend along and on one side wall of the insulating layer 430 and thus contact the second electrode 450.

Since an operating principle of the floating gate memristor device 400 according to the fourth embodiment is substantially the same as that of the floating gate memristor device 300 according to the third embodiment, detailed descriptions thereof will be omitted.

According to the floating gate memristor device of the fourth embodiment, an amount of charges stored in the floating gate may be adjusted to a plurality of states, based on the control voltages of '−$V_1$', '0', and '+$V_2$' applied to the control terminals of the first electrode. As a result, the conductance of the semiconductor channel or the amount of current flowing through the semiconductor channel may be adjusted to the plurality of states. Thus, the floating gate memristor device of the fourth embodiment may store data using the various voltage states of the conductance of the semiconductor channel or the amount of current flowing through the semiconductor channel. As a result, an amount of data that may be stored therein may be significantly increased.

Neuromorphic Device

FIG. 5 is a schematic diagram (A) of a bio neuron, and a graph (B) of a membrane potential variation a current neuron based on a spike potential of a previous neuron. FIG. 6 is a diagram for illustrating a neuromorphic device according to an embodiment of the present disclosure.

First, referring to FIG. 5, a neuron is a nerve cell that performs information processing in response to stimulation, and is composed of a neuron cell body including a dendrite and a nucleus, an axon, and an axon terminal.

The neuron cell body receives an electrochemical signal from several previous-neurons connected to a front end of a current neuron via a branch-shaped dendrite and processes the signal, and then transfer information to a subsequent-neuron via the axon and the axon terminal.

Various ions such as $Na^+$, $K^+$, and $Cl^-$ exist inside and outside the neuron. A membrane potential as a difference between a potential inside and a potential outside the cell is generated due to movement of the ions. The membrane potential maintains an idle state of about −70 mV normally. When a spike potential as an electrical signal was transmitted from the previous-neuron to the current-neuron, an excitatory postsynaptic potential (EPSP) or an inhibitory postsynaptic potential (IPSP) is generated and thus the membrane potential increases or decreases, depending on characteristics of a synapse as a connection between adjacent neurons.

In this connection, when the membrane potential is lower than a threshold voltage of about −50 mV to −55 mV, charges gradually exit the neuron which in turn returns to the idle state. This is referred to as 'leaky potential behavior of neuron'. To the contrary, when multiple excitatory postsynaptic potential (EPSPs) are sequentially delivered in a short time interval, the membrane potential varies by a sum of the EPSPs. This is referred to as 'integrate behavior of neuron'.

When the membrane potential becomes higher than the threshold voltage, a sodium ion channel ($Na^+$ channel) existing in the neuron cell membrane is opened and external sodium ions ($Na^+$) are introduced into the neuron. Then, the introduced sodium ions allows the neuron to generate the spike potential of about +30 mV as an activation potential, and transmits an electrical signal to the subsequent-neuron. This is referred to as 'fire behavior of neuron'. Next, the neuron discharges the potassium ions ($K^+$) through a potassium ion channel ($K^+$ channel) out of the cell and in turn returns to an original idle state. This behavior of the neuron is referred to as 'leaky integrate and fire behavior of neuron'. This process is a basic principle of a human brain operation.

Thus, a neuromorphic device 1000 according to an embodiment of the present disclosure which will be described below may implement the operation of the neuron as described above, using the floating gate memristor devices 100 and 200 according to the first and second embodiments according to the present disclosure.

Referring to FIG. 6, the neuromorphic device 1000 according to an embodiment of the present disclosure includes a floating gate memristor device 1100 and a reset voltage generator 1200.

The floating gate memristor device 1100 may include a substrate 1110, a floating gate 1120, an insulating layer 1130, a first electrode 1140, a second electrode 1150, a third electrode 1160, and a reset electrode 1180.

The substrate 1110, the floating gate 1120, the insulating layer 1130, the first electrode 1140, the second electrode 1150 and the third electrode 1160 are substantially the same as the substrate 110, the floating gate 120, the insulating layer 130, the first electrode 140, the second electrode 150, and the third electrode 160 of the floating gate memristor device 100 according to the first embodiment as described with reference to FIG. 1A and FIG. 1B respectively. Thus, detailed descriptions thereof will be omitted.

The reset electrode 1180 may be spaced apart from the first electrode 1140 and the second electrode 1150, and may be disposed on the insulating layer 1130 and may vertically overlap the floating gate 1120. When a reset voltage Vreset generated from the reset voltage generator 1200 is applied to the reset electrode 1180, charges accumulated in the floating gate 1120 may be discharged via tunneling of the charges between the reset electrode 1180 and the floating gate 1120.

The reset voltage generator 1200 may include an input terminal electrically connected to the third electrode 1160 of the floating gate memristor device 1100 and an output terminal electrically connected to the reset electrode 1180. The reset voltage generator 1200 may be configured to compare a voltage of the floating gate 1120 applied from the third electrode 1160 with a first threshold voltage Vth1. When the voltage of the floating gate 1120 is greater than the first threshold voltage Vth1, the reset voltage generator 1200 may generate the reset voltage Vreset and may apply the same to the reset electrode 1180. In one embodiment, the reset voltage generator 1200 may include a comparator configured as shown in FIG. 6. However, the present disclosure is not limited thereto.

In the example, the reset voltage generated from the reset voltage generator 1200 may be applied to the reset electrode 1180 as well as directly or indirectly to other neuromorphic devices.

FIG. 7 is a diagram for illustrating a neuromorphic device according to another embodiment of the present disclosure.

Referring to FIG. 7, a neuromorphic device 2000 according to another embodiment of the present disclosure includes a floating gate memristor device 2100 and a reset voltage generator 2200.

The floating gate memristor device 2100 may include a substrate 2110, a floating gate 2120, an insulating layer 2130, a first electrode 2140, a second electrode 2150, a third electrode 2160, and a reset electrode 2180.

The substrate 2110, the floating gate 2120, the insulating layer 2130, the first electrode 2140, the second electrode 2150 and the third electrode 2160 are substantially the same, respectively, as the substrate 210, the floating gate 220, the insulating layer 230, the first electrode 240, the second electrode 250 and the third electrode 260 of the floating gate memristor device 200 according to the second embodiment as described with reference to FIGS. 2A and 2B. Thus, the detailed descriptions thereof will be omitted.

The reset electrode 2180 may be spaced apart from the first electrode 2140, and may be disposed on the insulating layer 2130 and may vertically overlap the floating gate 2120. When the reset voltage Vreset generated from the reset voltage generator 2200 is applied to the reset electrode 2180, charges accumulated in the floating gate 2120 may be discharged via tunneling of the charges between the reset electrode 2180 and the floating gate 2120.

In one example, the reset voltage generator 2200 is substantially the same as the reset voltage generator 1200 of the neuromorphic device 1000 as described with reference to FIG. 6. Thus, a detailed description thereof is omitted.

According to the neuromorphic device according to the present disclosure, when the control voltages are applied to the control terminals of the first electrode of the floating gate memristor device, a potential of the floating gate increases sequentially, and becomes higher than the first threshold voltage of the reset voltage generator. In this case, a spike potential may be generated from a spike potential generator and may be output. Further, the charges accumulated in the floating gate may be discharged using the reset voltage generated by the reset voltage generator. Therefore, the neuromorphic device according to the present disclosure may implement the neuron behavior as described with reference to FIG. 5.

FIG. 8 shows measurements of a potential of a floating gate and a current of a semiconductor channel when +6V control voltages are sequentially applied to four control terminals of the floating gate memristor device having a structure of the third embodiment at a 1 second interval.

Referring to FIG. 8, it may be seen that when +6V control voltages V1, V2, V3, and V4 are sequentially applied to the four control terminals at a 1 second interval, respectively, the potential of the floating gate and the current of the semiconductor channel also increase stepwise.

FIG. 9 shows a result of measuring a conductance (G) in a semiconductor channel region located between the adjacent control terminals when a negative control voltage $-V_{12}$ is applied to a first control terminal among control terminals of the floating gate memristor device having the structure of embodiment 3 and when a positive control voltage $+V_{12}$ is applied to the first control terminal.

Referring to FIG. 9, it may be identified that the conductance of the semiconductor channel may vary depending on the control voltage. Further, even when the control voltage is applied to the first control terminal of the control terminals, conductance in all regions of the semiconductor channel varies simultaneously.

FIG. 10A is a diagram showing a configuration of a device manufactured for testing. FIG. 10B and FIG. 10C are graphs showing a variation in a potential of a floating gate as measured when a control voltage of 3.5V is sequentially applied to control terminals of the device shown in FIG. 10A.

Referring to FIG. 10A, FIG. 10B and FIG. 10C, the floating gate is charged using the control voltages input to the control terminals and a voltage $V_{FG}$ of the floating gate is gradually increased. When the voltage of the floating gate becomes larger than the threshold voltage of the comparator, the reset voltage may be generated from the reset voltage generator, Thus, the voltage $V_{FG}$ of the floating gate is rapidly reduced to an initial state.

Further, the voltage of the floating gate increases when a positive control voltage corresponding to the excitatory postsynaptic potential is applied to the control terminals. On the contrary, when a negative control voltage corresponding to the inhibitory postsynaptic potential is applied thereto, the voltage of the floating gate decreases.

FIG. 11A and FIG. 11B are graphs showing a variation of a floating gate potential $V_{FG}$ when an input potential $V_{in}$ is applied to a neuromorphic device of a structure shown in FIG. 10A where a thickness of an insulating layer is 7 nm and 4 nm, respectively. FIG. 11C is a graph measuring a variation in a retention time of a floating gate based on the thickness of the insulating layer.

Referring first to FIG. 11A, it may be seen that in the neuromorphic device with an insulating layer thickness of 7 nm, the charges charged in the floating gate are trapped over time. As a result, it may be seen that when a plurality of input potentials are sequentially applied thereto over time, the floating gate potential $V_{FG}$ increases stepwise according to the input potentials.

Subsequently, referring to FIG. 11B, it may be identified that in the neuromorphic device having an insulating layer thickness of 4 nm, the charges charged in the floating gate leak out from the floating gate over time. As a result, it may be identified that when the input potentials are applied thereto at a time interval larger than a charge leakage time from the floating gate, a process in which the floating gate potential $V_{FG}$ increases upon application of the input potentials and then decreases back to the initial potential is repeated. Subsequently, referring to FIG. 11C, it may be identified that a retention time increases rapidly as the thickness of the insulating layer increases. Thus, it is preferable that the thickness of the insulating layer is set to a range of 3 to 6 nm in order to realize the 'leaky' behavior of the neuron.

FIG. 12A to 12C are graphs measuring a variation of a floating gate potential with respect to an input potential to the neuromorphic device of the structure shown in FIG. 10A when the thickness of the insulating layer is 4 nm.

Referring to FIG. 12A to FIG. 12C, it may be identified that a neuron potential increases as the number of applied input potentials increases (the integrate behavior of the neuron). However, as shown in FIG. 12B, when a sum of the input potentials is lower than a threshold voltage $V_{th}$, there is no variation in an output voltage $V_{out}$. Thus, the floating gate potential $V_{FG}$ gradually returns to the initial voltage due to the charge leakage from the floating gate. In another example, as shown in FIG. 12C, it may be identified when the sum of the input potentials is higher than the threshold voltage $V_{th}$, a spike output potential is generated.

It will be understood that although the above disclosure has been described with reference to the preferred embodiment of the present disclosure, those skilled in the art may achieve modifications and changes thereto within a range that does not deviate from the spirit and region of the present disclosure as described in the following claims.

What is claimed is:

1. A floating gate memristor device comprising:
   a substrate;
   a floating gate disposed on the substrate;
   an insulating layer covering the floating gate;
   a semiconductor channel disposed on the insulating layer and vertically overlapping the floating gate;
   a first electrode including a plurality of control terminals disposed on the semiconductor channel and spaced apart from each other, wherein the plurality of control terminals vertically overlap the floating gate; and
   a second electrode spaced away from the first electrode, wherein a ground voltage is applied to the second electrode.

2. The floating gate memristor device of claim 1, wherein the second electrode is disposed on the semiconductor channel.

3. The floating gate memristor device of claim 1, wherein the second electrode is disposed between the substrate and the floating gate and vertically overlaps all of the control terminals.

4. The floating gate memristor device of claim 1, wherein a control voltage selected from a group consisting of a ground voltage, a first control voltage greater than the ground voltage, and a second control voltage lower than the ground voltage is sequentially applied to the control terminals at a predetermined interval,
   wherein when a control voltage is applied to a first control terminal of the control terminals, charges tunnel between the first control terminal and the floating gate,
   wherein an amount of current flowing through the semiconductor channel or a conductance of the semiconductor channel is controlled based on the control voltages applied to the control terminals.

* * * * *